US007209340B2

(12) United States Patent
Iioka et al.

(10) Patent No.: US 7,209,340 B2
(45) Date of Patent: Apr. 24, 2007

(54) SEMICONDUCTOR DEVICE AND MIM CAPACITOR

(75) Inventors: Osamu Iioka, Kawasaki (JP); Ikuto Fukuoka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/522,410

(22) Filed: Sep. 18, 2006

(65) Prior Publication Data

US 2007/0013029 A1 Jan. 18, 2007

Related U.S. Application Data

(62) Division of application No. 11/157,823, filed on Jun. 22, 2005, now Pat. No. 7,126,809.

(30) Foreign Application Priority Data

Mar. 17, 2005 (JP) ............................ 2005-078012

(51) Int. Cl.
*H01G 4/228* (2006.01)
*H01L 29/00* (2006.01)

(52) U.S. Cl. ............ 361/306.3; 257/532; 257/E27.071; 257/E29.343

(58) Field of Classification Search ................ 257/516, 257/535, 534, 533, E27.048, E27.071, E29.343; 361/306.3
See application file for complete search history.

(56) References Cited

U.S. PATENT DOCUMENTS 5,583,359 A * 12/1996 Ng et al. .................... 257/306
6,690,570 B2 * 2/2004 Hajimiri et al. ......... 361/306.1
6,864,526 B2 * 3/2005 Inbe ........................... 257/300
6,903,402 B2 * 6/2005 Miyazawa .................. 257/296
7,009,832 B1 * 3/2006 Chen et al. .............. 361/306.1
2006/0157766 A1 * 7/2006 Won et al. .................. 257/296

FOREIGN PATENT DOCUMENTS

JP 2004-95754 3/2004
JP 2004-241762 8/2004

* cited by examiner

*Primary Examiner*—Evan Pert
*Assistant Examiner*—Victor Mandala, Jr.
(74) *Attorney, Agent, or Firm*—Westerman, Hattori, Daniels & Adrian, LLP.

(57) ABSTRACT

An MIM capacitor comprises first and second conductor patterns embedded in a first interlayer insulation film so as to extend continuously in a mutually opposing relationship and forming a part of a comb-shaped capacitor pattern, and third and fourth conductor patterns formed in a second interlayer insulation film separated from the first interlayer insulation film by a via-insulation film, such that the third and fourth conductor patterns extend in the second layer interlayer insulation film continuously in a mutually opposing relationship as a part of the comb-shaped capacitor pattern, wherein there is formed a fifth conductor pattern extending in the via-insulation film continuously in correspondence to the first and third conductor patterns so as to connect the first and third conductor patterns continuously, and wherein there is formed a sixth conductor pattern extending in the via-insulation film continuously in correspondence to the second and fourth conductor patterns so as to connect the second and fourth conductor patterns continuously.

9 Claims, 9 Drawing Sheets

10
13
12
11
11A
11B
11A
11B
11b
11A
C
C
C
C
13A
12A
13B
12B
13A
12A
13B
12b
12B
13A
12a
12A
11a 20
10
25
24N
24
23N
23
22
21
25A
25B
25M
25a
24A
24B
23A
23B
23a
22A
22B
21a
21b
21A
21I
24M
23M

SEMICONDUCTOR DEVICE AND MIM CAPACITOR

CROSS-REFERENCE TO RELATED APPLICATION

The present application is a Divisional application of U.S. application Ser. No. 11/157,823, filed on Jun. 22, 2005 now U.S. Pat. No. 7,126,809, which is based on Japanese priority application No. 2005-078012 filed on Mar. 17, 2005, the entire contents of which are hereby incorporated by reference.

BACKGROUND OF THE INVENTION

The present invention generally relates to semiconductor devices and more particularly to a semiconductor device having a capacitor.

A so-called MIM (metal-insulator-metal) capacitor is used extensively as a capacitance element in various analog circuits including A/D converters or semiconductor integrated circuits that includes a pump circuit of a flash memory.

Such an MIM capacitor is generally integrated into a multilayer interconnection structure such that the MIM capacitor constitutes a part of the multilayer interconnection structure.

FIG. 1 shows an example of a conventional MIM capacitor.

Referring to FIG. 1, the MIM capacitor is formed of a metal pattern M1 constituting a first metal layer of a multilayer interconnection structure, a metal pattern M2 opposing the metal pattern M1 across an interlayer insulation film not illustrated and constituting a second metal layer of the multilayer interconnection structure, and a metal pattern M3 opposing the metal pattern M2 across an interlayer insulation film not illustrated and constituting a third metal layer of the multilayer interconnection structure. Thereby, a capacitance C is formed above and below the metal pattern M2.

In the illustrated example, the metal pattern M1 and the metal pattern M3 are connected parallel with each other, and there is formed a capacitor having a capacitance value 2C such that the capacitor has the metal pattern M2 as a first electrode and the metal patterns M1 and M3 as the second electrode.

With the semiconductor device having such an MIM capacitor, it should be noted that the capacitor itself is miniaturized with miniaturization of the semiconductor device, and thus, there arises a problem of securing sufficient capacitance, particularly for such highly miniaturized capacitors.

In order to secure sufficient capacitance value with such an MIM capacitor integrated to the multilayer interconnection structure also for the case the area of the electrodes is reduced, it is necessary to reduce the thickness of the interlayer insulation film interposed between the metal patterns M1, M2 and M3. However, in the case the MIS capacitor is integrated to the multilayer interconnection structure, such decrease of film thickness of the interlayer insulation film inevitably leads to the problem of increased stray capacitance between the interconnection patterns formed in the multilayer interconnection structure.

Because of such situations and circumstances, it has been difficult to reduce the size of the MIM capacitor shown in FIG. 1, and there has been caused a problem at the time of designing a semiconductor integrated circuit device that uses such an MIM capacitor.

Meanwhile, there is proposed an MIM capacitor shown in FIG. 2 that uses a comb-shaped electrode formed in a multilayer interconnection structure. Reference should be made to Patent Reference 1.

REFERENCES (Patent Reference 1) Japanese Laid-Open Patent Application 2004-95754

(Patent Reference 2) Japanese Laid-Open Patent Application 2004-241762

Referring to FIG. 2, there is formed a lower capacitor part M1 on a lower interlayer insulation film not illustrated, wherein the lower capacitor part M1 has comb-shaped electrodes M1*a* and M1*b* formed of a first layer metal pattern. Further, there is formed an upper capacitor part M2 on a second interlayer insulation film not illustrated such that the upper capacitor part M2 has comb-shaped electrodes M1*a* and M1*b* of a second layer metal pattern. Further, the lower capacitor part M1 and the upper capacitor part M2 are connected with each other by a number of via-plugs Via formed in the second interlayer insulation film.

According to such a construction, decrease of capacitance of the MIM capacitor caused by the decrease of the electrode area can be successfully compensated by the reduced distance between the comb-shaped electrodes M1*a* and M1*b* or the distance between the comb-shaped electrodes M2*a* and M2*b*.

Further, according to the second construction, it becomes possible to secure sufficient capacitance for the MIM capacitor even when the semiconductor device is miniaturized, by forming capacitors above and below the interlayer insulation film and connecting the same in parallel by way of the via-plugs Via.

On the other hand, in the case the MIM capacitor of FIG. 2 is miniaturized, the comb-shaped electrodes M1*a* and M2*b* or M1*a* and M1*b* constituting a capacitor in the upper capacitor part M2 or lower capacitor part M1, are disposed with minute mutual separation, and because of this, the via-plugs Via on the respective comb-shaped electrodes are disposed also with minute separation. Thereby, the electric flux lines connecting these via-plugs Via shown in FIG. 3 may cause substantial stray capacitance, of which value is difficult to evaluate.

It should be noted that in the case of an A/D converter, a precision of 5% or less is required for the capacitor used therein. Thus, such an MIM capacitor cannot provide reliable operation of the A/D converter. Further, designing of circuit becomes difficult in view of the need of tolerating large error for the MIM capacitance.

SUMMARY OF THE INVENTION

In a first aspect, the present invention provides a semiconductor device having an MIM capacitor in a multilayer interconnection structure, said multilayer interconnection structure comprising:

a first interconnection layer embedded in a first interlayer insulation film;

a second interlayer insulation film formed on said first interlayer insulation film;

a third interlayer insulation film formed on said first interlayer insulation film via said second interlayer insulation film;

a second interconnection layer embedded in said third interlayer insulation film; and a via-plug formed in said second interlayer insulation film so as to connect said first interconnection layer to said second interconnection layer electrically, said first interconnection layer comprising first and second conductor patterns embedded in said first interlayer insulation film and extending continuously in said first interlayer insulation film in a mutually opposing relationship, said second interconnection layer comprising third and fourth interconnection patterns embedded in said third interlayer insulation film respectively in correspondence to said first and second conductor patterns, said third and fourth conductor patterns extending continuously in said third interlayer insulation film in a mutually opposing relationship, wherein said second interlayer insulation film includes a fifth conductor pattern embedded therein so as to extend continuously in said second interlayer insulation film in correspondence to said first and third conductor patterns, said fifth conductor pattern connecting said first and third conductor patterns continuously, and said second interlayer insulation film including a sixth conductor pattern embedded therein so as to extend continuously in said second interlayer insulation film in correspondence to said second and fourth conductor patterns, said sixth conductor pattern connecting said second and fourth conductor patterns continuously, said first and second conductor patterns, said third and fourth conductor patterns and said fifth and sixth conductor patterns forming together an MIM capacitor.

In another aspect, the present invention provides an MIM capacitor, comprising:

first and second conductor patterns embedded in a first insulation film so as to extend in said first insulation film continuously in a mutually opposing relationship; and third and fourth conductor patterns embedded in a third insulation film formed on said first insulation film via a second insulation film, said third and fourth conductor patterns extending in said third insulation film continuously in a mutually opposing relationship, wherein said second interlayer insulation film includes a fifth conductor pattern embedded therein so as to extend continuously in said second interlayer insulation film in correspondence to said first and third conductor patterns, said fifth conductor pattern connecting said first and third conductor patterns continuously, said second interlayer insulation film further including a sixth conductor pattern embedded therein so as to extend continuously in said second interlayer insulation film in correspondence to said second and fourth conductor patterns, said sixth conductor pattern connecting said second and fourth conductor patterns continuously.

According to the present invention, the first and second conductor patterns form a capacitor in the first interconnection layer and the third and fourth conductor patterns form a capacitor in the second interconnection layer, wherein the stray capacitance, formed between via-plugs in the construction in which the first and third conductor patterns and the second and fourth conductor patterns are connected with each other by discrete via-plugs, is reduced by connecting the first conductor pattern and the third conductor pattern continuously by the fifth conductor pattern extending in conformity with the pattern shape and by connecting the second conductor pattern and the fourth conductor pattern continuously by the sixth conductor pattern extending along the pattern shape. Thereby, the MIM capacitor provides the designed capacitance value. Because the capacitance is formed with the MIM capacitor of the present invention between opposing conductor patterns in each of the interconnection layers, there occurs no decrease of capacitance value with device miniaturization, even in the case the MIM capacitor is integrated into a multilayer interconnection structure. Further, it is possible to achieve device miniaturization without decreasing the thickness of the interlayer insulation film. Thus, by using the MIM capacitor of the present invention, it becomes possible to miniaturize the apparatus such as an A/D converter that requires exact capacitance value for the capacitor formed therein. Further, by using the MIM capacitor of the present invention, it becomes possible to realize a desired boosting performance in a pump circuit of a flash memory device even in the case the device is subjected to miniaturization. Further, the MIM capacitor of the present invention is useful not only in silicon semiconductor devices but also in compound semiconductor devices such as MMIC.

Other objects and further features of the present invention will become apparent from the following detailed description when read in conjunction with the attached drawings.

DETAILED DESCRIPTION OF THE INVENTION

First Embodiment

Figure 4:
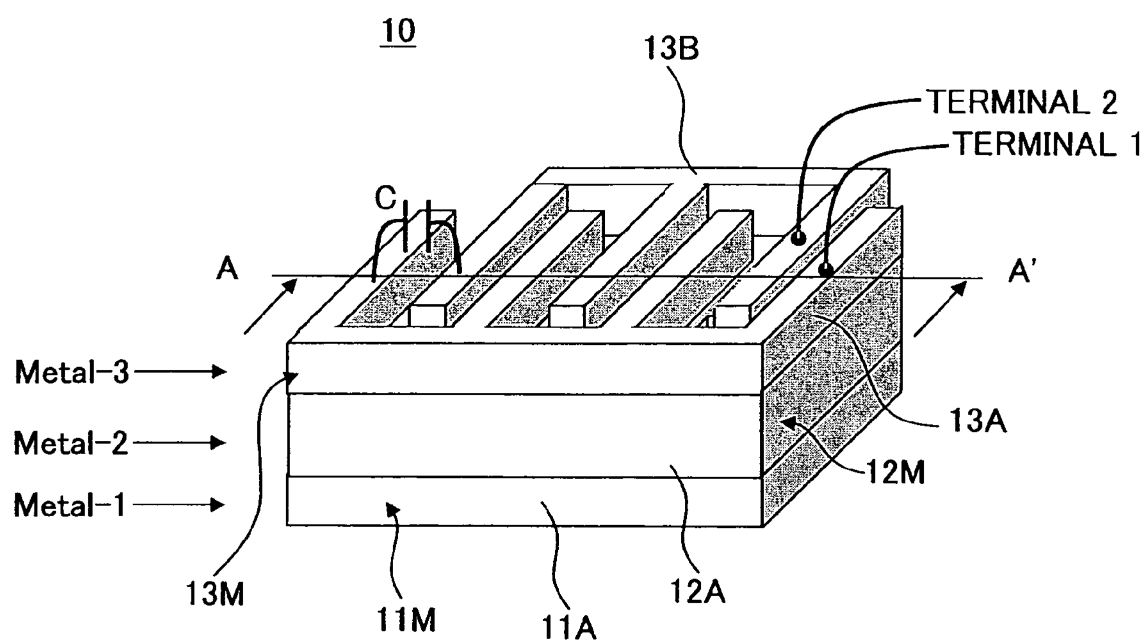
FIG. 4 is an oblique view diagram showing the construction of an MIM capacitor according to a first embodiment of the present invention.
Figure 5:
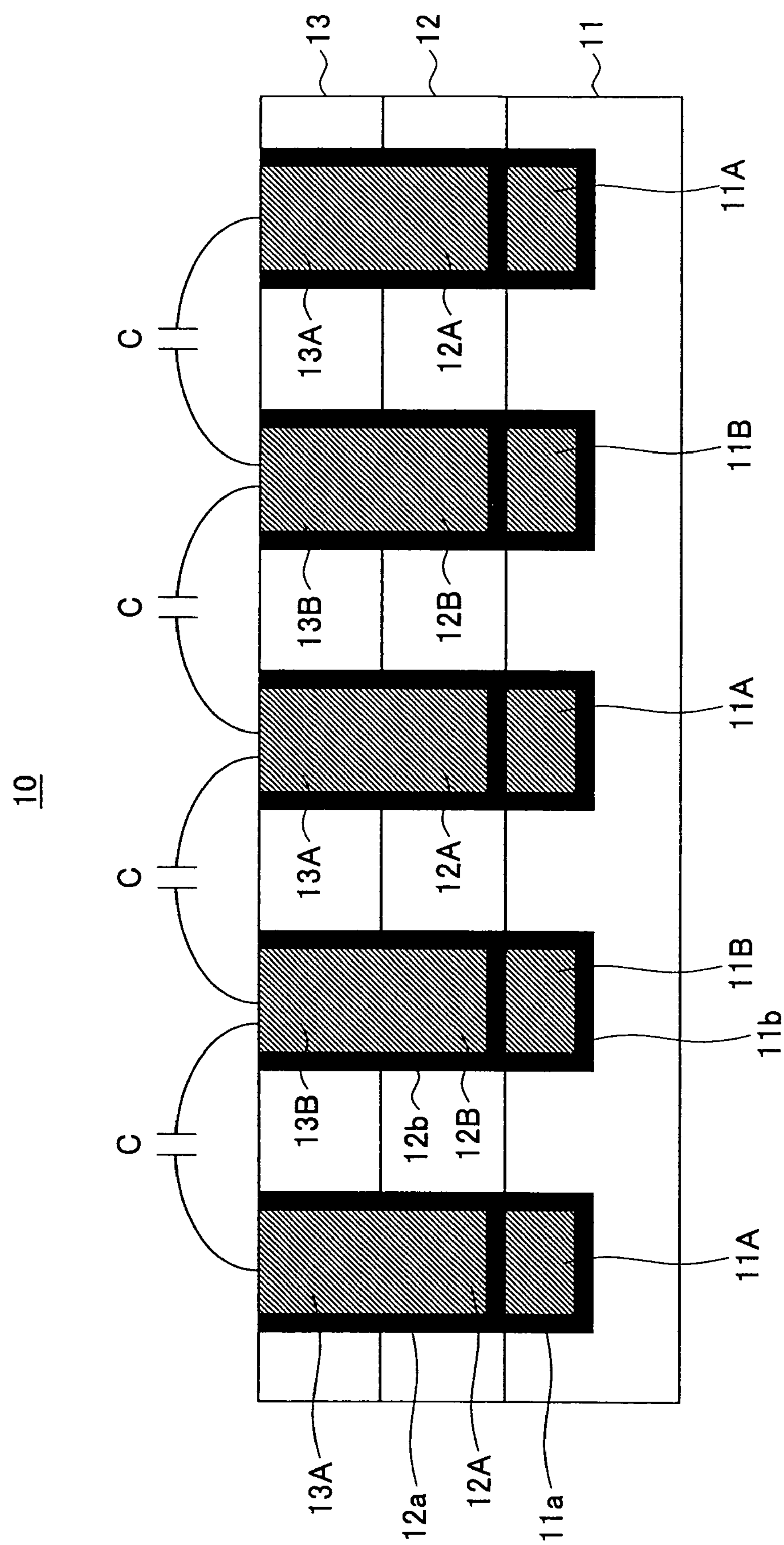
FIG. 5 is a diagram showing the cross-section of the MIC capacitor of FIG. 4.

FIG. 4 is an oblique view diagram showing the construction of an MIM capacitor 10 according to a first embodiment of the present invention while FIG. 5 is a cross-sectional view of the MIM capacitor 10 taken along a line A–A' of FIG. 4.

Referring to FIGS. 4 and 5, the MIM capacitor 10 is formed in a multilayer interconnection structure formed of a first interlayer insulation film 11, a second interlayer insulation film 12 on the first interlayer insulation film 11, and a third interlayer insulation film on the second interlayer insulation film, wherein the MIM capacitor 10 is formed of a comb-shaped capacitor pattern 11M embedded in the first interlayer insulation film 11 as a part of a first interconnection layer Metal-1, a comb-shaped capacitor pattern 13M embedded in the third interlayer insulation film 13 as a part of a second interconnection layer Metal-3, and a connection part 12M also of a comb-shaped form and embedded in the second interlayer insulation film as a part of a via layer Metal-2, wherein the connection part 12M connects the comb-shaped capacitor pattern 11M with the comb-shaped capacitor pattern 13M.

It should be noted that the comb-shaped capacitor pattern 13M includes a first comb-shaped electrode pattern 13A and a second comb-shaped electrode pattern 13B forming together mutually opposing electrode fingers, wherein similar comb-shaped conductor patterns 12A and 12B forming similar mutually opposing electrode fingers are formed also in the connection part 12M and in the comb-shaped capacitor pattern 11M respectively. In the oblique view diagram of FIG. 4, only the electrode fingers of the uppermost comb-shaped electrode patterns 13A and 13B are represented.

As shown in the cross-sectional diagram of FIG. 5, the comb-shaped conductor pattern 12A is formed as a continuation part of the comb-shaped electrode pattern 13A and the comb-shaped conductor pattern 12B is formed as a continuation part of the comb-shaped electrode pattern 13B in the present embodiment, such that the comb-shaped conductor pattern 12A has the same shape and size to the comb-shaped electrode pattern 13A and that the comb-shaped conductor pattern 12B has the same shape and size of the comb-shaped electrode pattern 13B. Further, the comb-shaped electrode patterns 11A and 11B are formed in the interlayer insulation film 11 respectively in correspondence to the comb-shaped conductor patterns 12A and 12B with the same shape and same size.

Thereby, it should be noted that the comb-shaped electrode patterns 11A and 11B have respective sidewall surfaces and bottom surfaces covered by a barrier metal film 11*a* or 11*b* of refractory metal or refractory metal nitride, and similar barrier metal films 12*a* and 12*b* are provided also to the comb-shaped conductor patterns 12A and 12B so as to cover the respective sidewall surfaces and the bottom surfaces. Because the comb-shaped conductor patterns 12A and 12B form the extension parts of the comb-shaped electrode patterns 13A and 13B, respectively, the barrier metal films 12*a* and 12*b* also extend into the interlayer insulation film 13 and covers the sidewall surfaces of the comb-shaped electrode patterns 13A and 13B. In other words, there is formed no barrier metal film between the comb-shaped conductor pattern 12A and the comb-shaped electrode pattern 13A, and no barrier metal film is formed also between the comb-shaped conductor pattern 12B and the comb-shaped electrode pattern 13B. Further, the comb-shaped conductor pattern 12A makes a contact with the comb-shaped electrode pattern 11A underneath via the barrier metal film 12a, and the comb-shaped conductor pattern 12B makes a contact with the underlying comb-shaped electrode pattern 11B via the barrier metal film 12*b*.

With the MIM capacitor 10 of such a construction, the comb-shaped conductor patterns 12A and 12B constituting the connection part 12M form also a part of the comb-shaped capacitor pattern, and there is formed a capacitance C between the electrode finger of any of the comb-shaped electrode patterns 11A–13A and a corresponding electrode finger of the comb-shaped electrode patterns 11B–13B. Because such a capacitance C increases with decrease of distance between the opposing electrode fingers, the MIM capacitor can effectively compensate for the decrease of capacitance of the capacitor area as a result of the device miniaturization.

Figure 1:
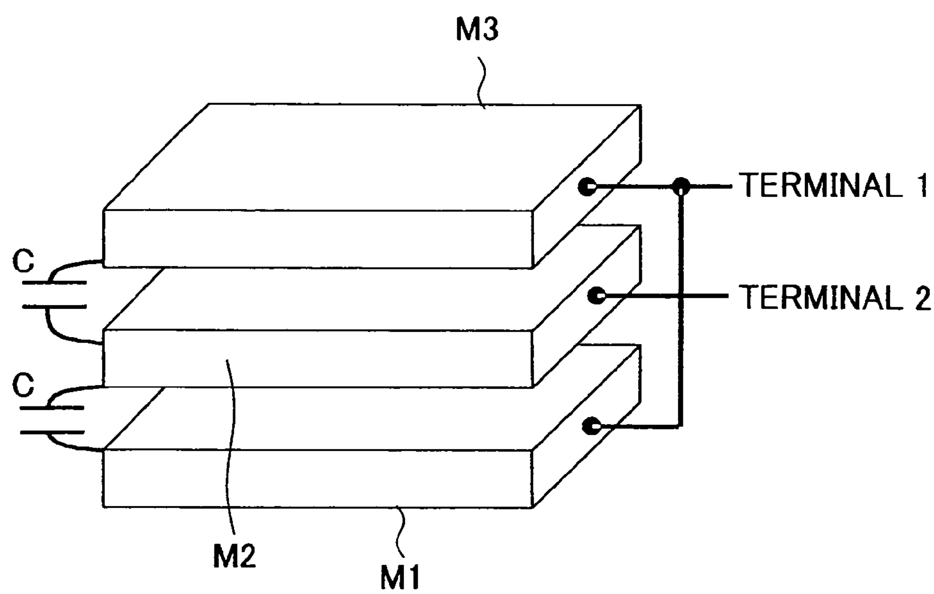
FIG. 1 is an oblique view diagram showing the construction of an MIM capacitor according to a related art.
Figure 2:
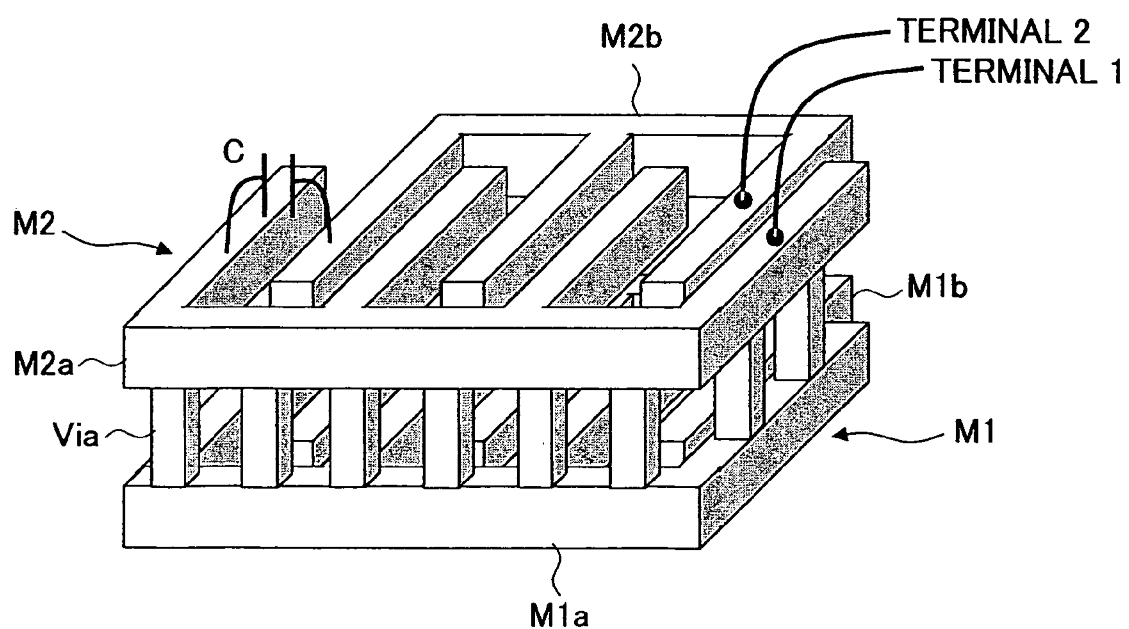
FIG. 2 is an oblique view diagram showing the construction of an MIM capacitor according to another related art.
Figure 3:
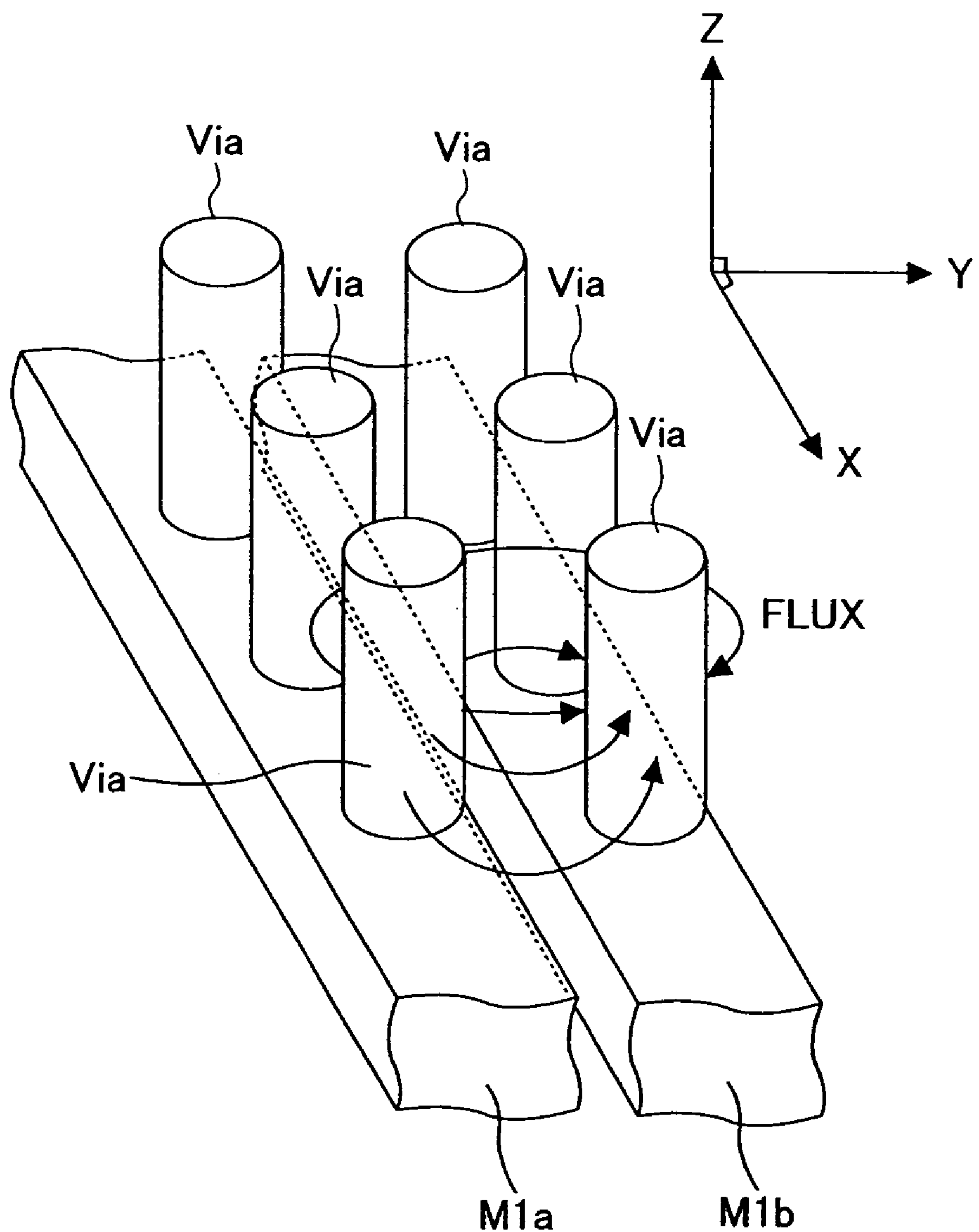
FIG. 3 is a diagram explaining the problems of the MIM capacitor of FIG. 2.

Here, it should be noted that, contrary to the conventional art explained with reference to FIGS. 2 and 3, electrical interconnection between the comb-shaped electrode pattern 11A and the comb-shaped electrode pattern 13A, or the comb-shaped electrode pattern 11B and the comb-shaped electrode pattern 13B, is achieved not by way of the discrete via-plugs but by way of the comb-shaped pattern 12A or 12B extending continuously in conformity with the shape of the comb-shaped electrode patterns above and below. Thereby, no stray capacitance is formed between the via-plugs, and the MIM capacitor 10 provides a capacitance of designed capacitance value. Here, it should be noted that all of the comb-shaped electrode patterns 11A–13A and the comb-shaped electrode patterns 11B–13B contribute to the formation of the capacitance, and thus, it is possible to secure a larger capacitance as compared with the conventional comb-shaped MIM capacitor explained with reference to FIGS. 2 and 3.

Second Embodiment

Figure 6:
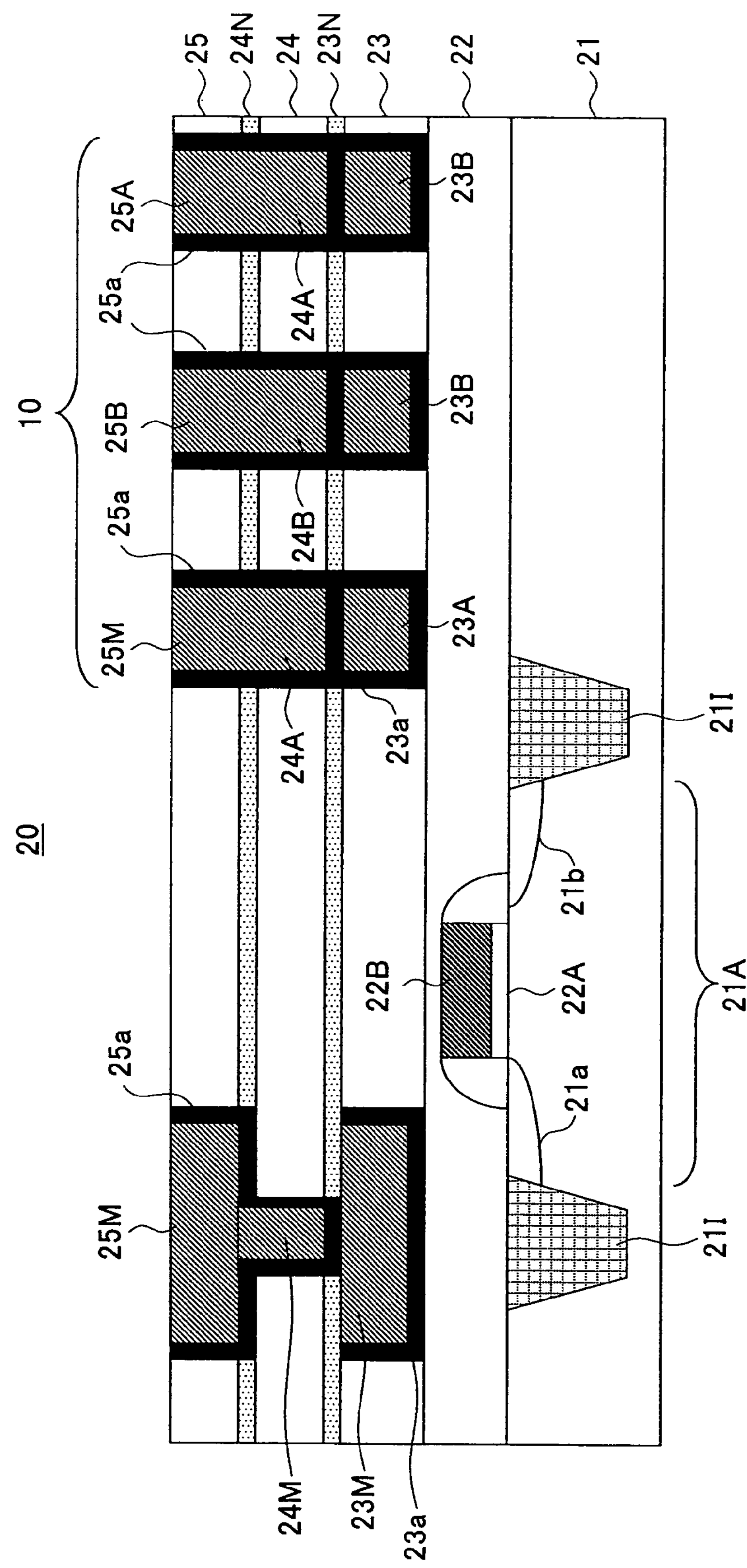
FIG. 6 is a diagram showing the construction of a semiconductor device according to a second embodiment of the present invention.

FIG. 6 shows the construction of a semiconductor device 20 according to a second embodiment of the present invention in which the MIM capacitor 10 of FIGS. 4 and 5 is integrated to a multilayer interconnection structure.

Referring to FIG. 6, the semiconductor device 20 is formed on a silicon substrate 21, and a MOS transistor is formed in a device region 21A defined on the silicon substrate 21 by a device isolation region 21I. The MOS transistor includes a source diffusion region 21*a*, a drain diffusion region 21*b*, a gate insulation film 22A and a gate electrode 22B.

It should be noted that the gate electrode 22B of the MOS transistor is covered with an insulation film 22 formed on the silicon substrate 21, and a multilayer interconnection structure of damascene structure is formed on the insulation film 22 in the form of lamination of the first interlayer insulation film 23, a first etching stopper film 23N, a second interlayer insulation film 24, a second etching stopper film 24N and a third interlayer insulation film 25. Typically, the interlayer insulation films 23, 24 and 25 are formed of a low-K dielectric organic insulation film including a porous film or organic SOG film, while it is also possible to use an inorganic film such as an HSQ (hydrogen silsesquioxane) film or $SiO_2$ film for the interlayer insulation films. Further, the etching stopper films 23N and 24N are formed typically of an SiN film or an SiC film.

With the multilayer interconnection structure of FIG. 6, an interconnection trench is formed in the first interlayer insulation film 23, and the interconnection trench is filled with a first layer metal interconnection pattern 23M of Cu, or the like, via a barrier metal film 23*a* of a refractory metal such as Ta or Ti or a refractory metal nitride such as TaN or TiN.

Further, the third interlayer insulation film 25 is also formed with an interconnection trench, and a metal interconnection pattern 25M of Cu, or the like, fills the interconnection trench via a barrier metal film 25*a* similar to the barrier metal film 23*a*. Thereby, it should be noted that a Cu via-plug 24M extends from the metal interconnection pattern 25M into the interlayer insulation film 24 as a part of the metal interconnection pattern 25M and makes a contact with the interconnection pattern 23M in the interlayer insulation film 23 electrically. Further, the barrier metal film 25*a* covers the sidewall surface and the bottom surface of the Cu via-plug 24M continuously, and the Cu via-plug 24M makes a contact with the surface of the Cu metal interconnection pattern 23M via the barrier metal film 25*a*.

In the present embodiment, it should be noted that the metal interconnection pattern 25A has the shape and size identical to the metal interconnection pattern 23A. Further, the metal interconnection pattern 25B has the shape and size identical to the shape and size of the metal interconnection pattern 23B.

Further, with the multilayer interconnection structure of FIG. 6, there are formed comb-shaped Cu electrode patterns 23A and 23B in the interlayer insulation film 23 in correspondence to the electrode fingers 11A and 11B of the MIM capacitor 10 explained previously with reference to FIGS. 4 and 5 in the state that the Cu electrode patterns 23A and 23B are covered by the barrier metal film 23*a* at the sidewall surface and bottom surface thereof. Further, intermediate Cu patterns 24A and 25A of the comb-shaped form are formed respectively in the interlayer insulation films 24 and 25 in correspondence to the Cu electrode pattern 23 in the state that the Cu intermediate patterns 24A and 25A are covered with the barrier metal film 25*a*. Further, in correspondence to the Cu electrode pattern 23B, there are formed Cu intermediate patterns 24B and 25B of the comb-shaped form respectively in the interlayer insulation films 24 and 25 in the state that the Cu intermediate patterns 24B and 25B are covered by the barrier metal film 25*a*.

Here, the Cu pattern 24A forms an extension part of the comb-shaped Cu electrode pattern 25A similarly to the via-plug 24M, except that the Cu pattern 24A extends continuously in conformity with the shape of the comb-shaped Cu electrode pattern 25A contrary to the via-plug 24M. Thus, the Cu pattern 24A has also the same shape and size to the Cu electrode pattern 23A and makes a continuous contact to the Cu electrode pattern 23A.

Similarly, the Cu pattern 24B forms an extension part of the comb-shaped Cu electrode pattern 25B similarly to the via-plug 24M, except that the Cu pattern 24B extends continuously in conformity with the shape of the comb-shaped Cu electrode pattern 25B contrary to the via-plugs 24M. Thus, the Cu pattern 24B has also the same shape and size to the Cu electrode pattern 23B and makes a continuous contact to the Cu electrode pattern 23B.

Thus, with the present embodiment, the multilayer interconnection structure is integrated with the MIM capacitor having the construction explained with reference to FIGS. 3 and 4 that the MIM capacitor is formed of the first comb-shaped electrode including the electrode fingers of the comb-shaped Cu patterns 23A, 24A and 25A, and the second comb-shaped electrode including the electrode fingers of the comb-shaped Cu patterns 23B, 24B and 25B.

FIGS. 7A–7E show the fabrication process of the semiconductor device 20 of FIG. 6.

Figure 7A:
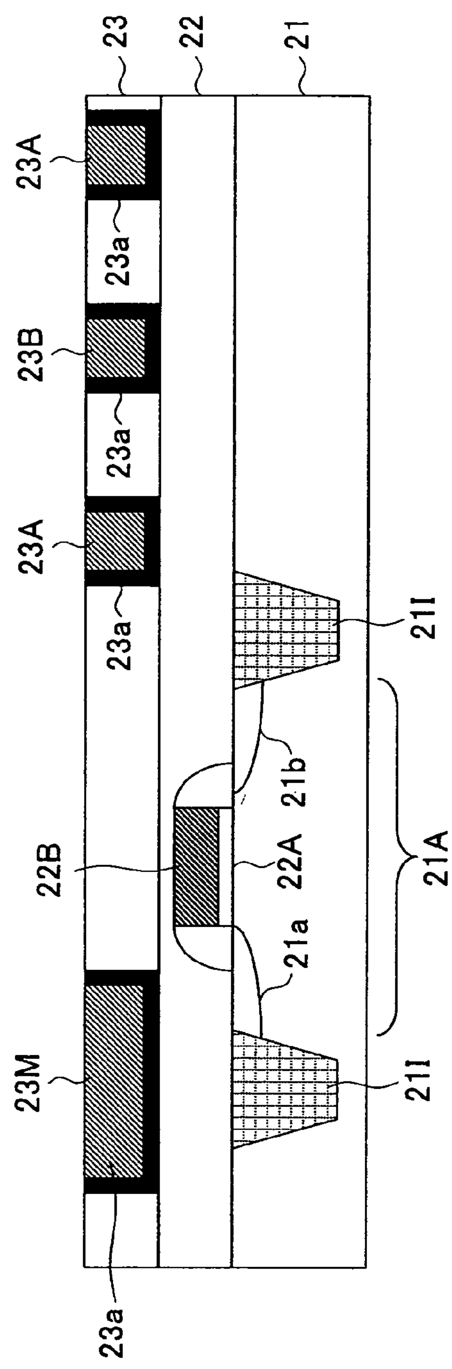
FIGS. 7A–7E are diagrams showing the fabrication process of the semiconductor device of FIG. 6.

Referring to FIG. 7A, the MOS transistor is formed first on the device region 21A of the silicon substrate 21 such that the MOS transistor has the source and drain diffusion regions 21*a* and 21, the gate insulation film 22A and the gate electrode 23, and the interlayer insulation film 23 is formed thereafter on the silicon substrate 21 via the insulation film 22.

In the step of FIG. 7A, an interconnection trench is formed in the interlayer insulation film 23 together with a comb-shaped trench having a shape corresponding to the comb-shaped pattern of the MIM capacitor 10, wherein the comb-shaped trench thus formed is filled with a Cu layer after covering the surface and the sidewall surface thereof by the barrier metal film 23*a*. Thereafter, excessive Cu layer is removed from the surface of the interlayer insulation film 23 by a CMP process. Thus, the surface of the Cu interconnection pattern 23M and the surface of the Cu patterns 23A and 23B form a planarized surface coincident to the surface of the interlayer insulation film 23.

Figure 7B:
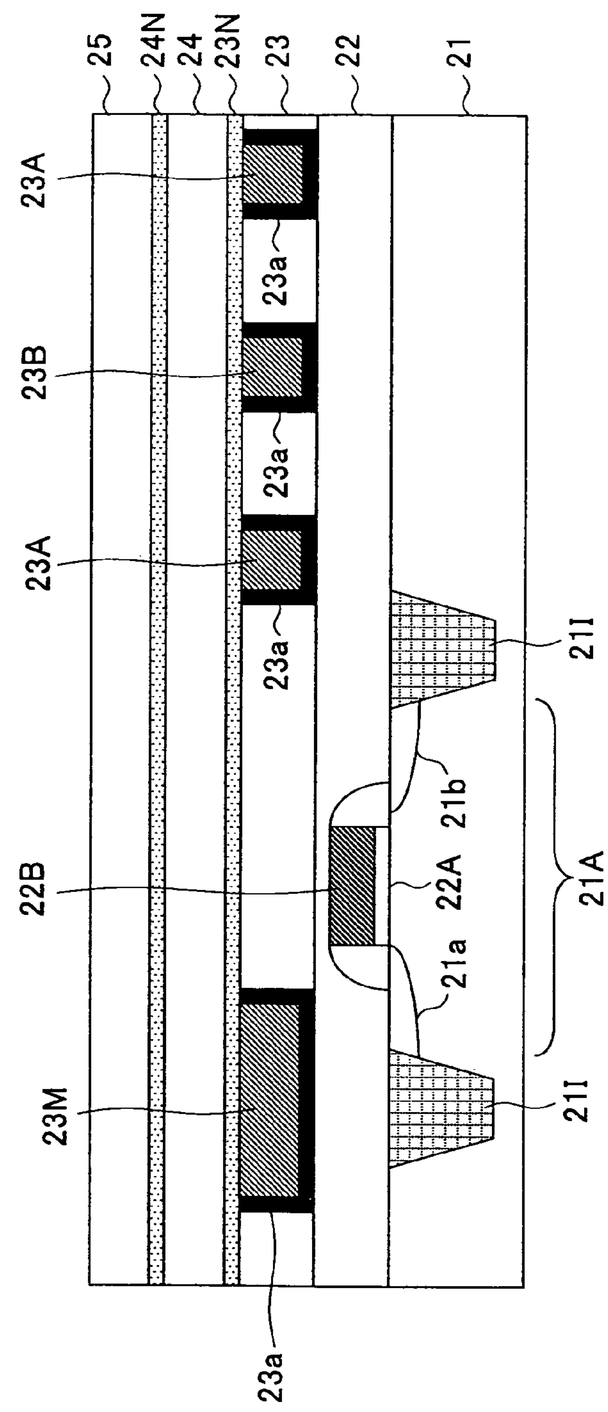
Figures 7C, 7D:
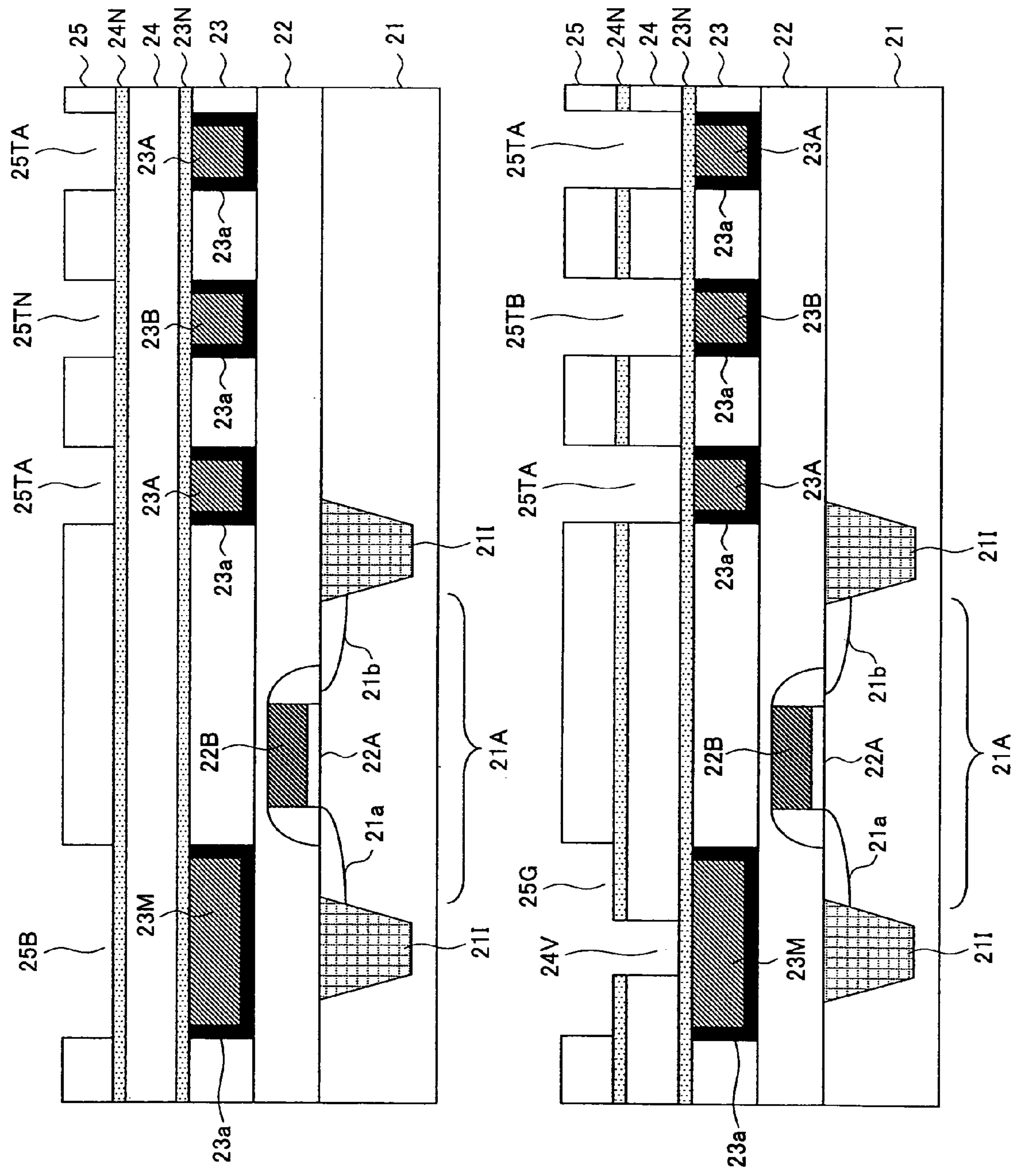
Figure 7E:
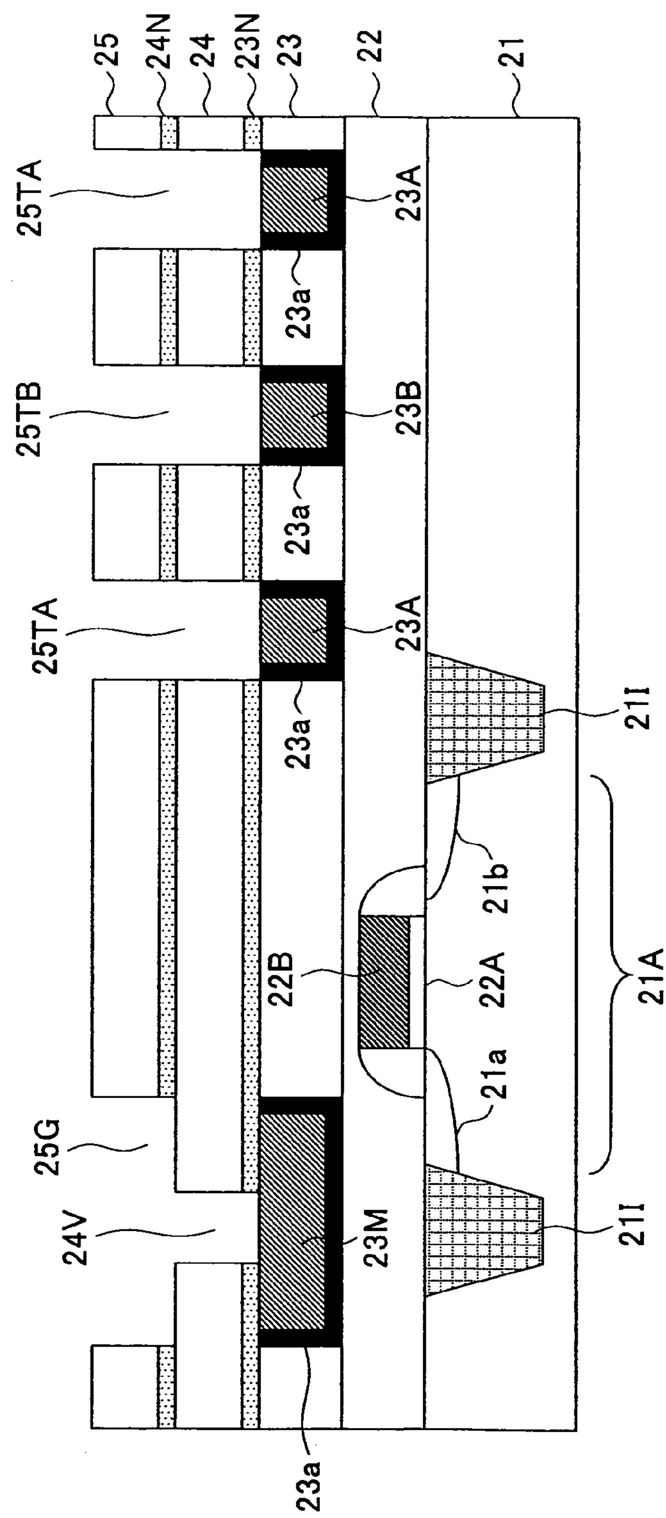

Next, in the step of FIG. 7B, the etching stopper film 23N, the interlayer insulation film 24, the etching stopper film 24N and the interlayer insulation film 25 are formed on the interlayer insulation film 23 consecutively, and an interconnection trench 25G is formed in the interlayer insulation film 25 in the step of FIG. 7C in correspondence to the interconnection pattern 25M such that the etching stopper film 24N is exposed. At the same time, the comb-shaped trenches 25TA and 25TB are formed in the interlayer insulation film 25 in correspondence to the Cu patterns 25A and 25B such that the etching stopper film 24N is exposed.

Further, in the step of FIG. 7D, a via-hole 24V is formed in the interconnection trench 25G exposing the etching stopper film 24N such that the via-hole 24V exposes the etching stopper film 23N, and at the same time, the comb-shaped trenches 25TA and 25TB, exposing the etching stopper film 24N, are extended so as to expose the etching stopper film 23N.

Further, in the step of FIG. 9E, the part of the etching stopper film 23N exposed at the bottom of the interconnection trench 25G, at the bottom of the via hole 24V and at the bottom of the comb-shaped trenches 25TA and 25TB is removed, such that the interconnection pattern 23M and the comb-shaped Cu patterns 23A and 23B are exposed. Further, the interconnection trench 25G, the via-hole 24V and the comb-shaped trenches 25TA and 25TB are filled with a Cu layer after covering the sidewall surface and bottom surface thereof with the barrier metal film 25*a*. Further, by removing excessive Cu layer on the interlayer insulation film 25 by a CMP process, the structure explained previously with reference to FIG. 6 is obtained.

In the present embodiment, it is possible to integrate the MIM capacitor 10 of FIGS. 4 and 5 into the multilayer interconnection structure of the semiconductor integrated circuit device, and it becomes possible to secure a sufficient capacitance even when the semiconductor integrated circuit device is miniaturized without decreasing the thickness of the interlayer insulation films 24 and 25.

Because the comb-shaped Cu pattern 23A or 23B is connected to the corresponding comb-shaped Cu pattern 25A or 25B continuously by using the comb-shaped Cu pattern 24A or 24B, there arises no such a difficulty of evaluating the stray capacitance as in the case these comb-shaped patterns are connected by discrete via-plugs, and it becomes possible to realize a capacitance value controlled precisely to the designed capacitance value.

Third Embodiment

Figure 8:
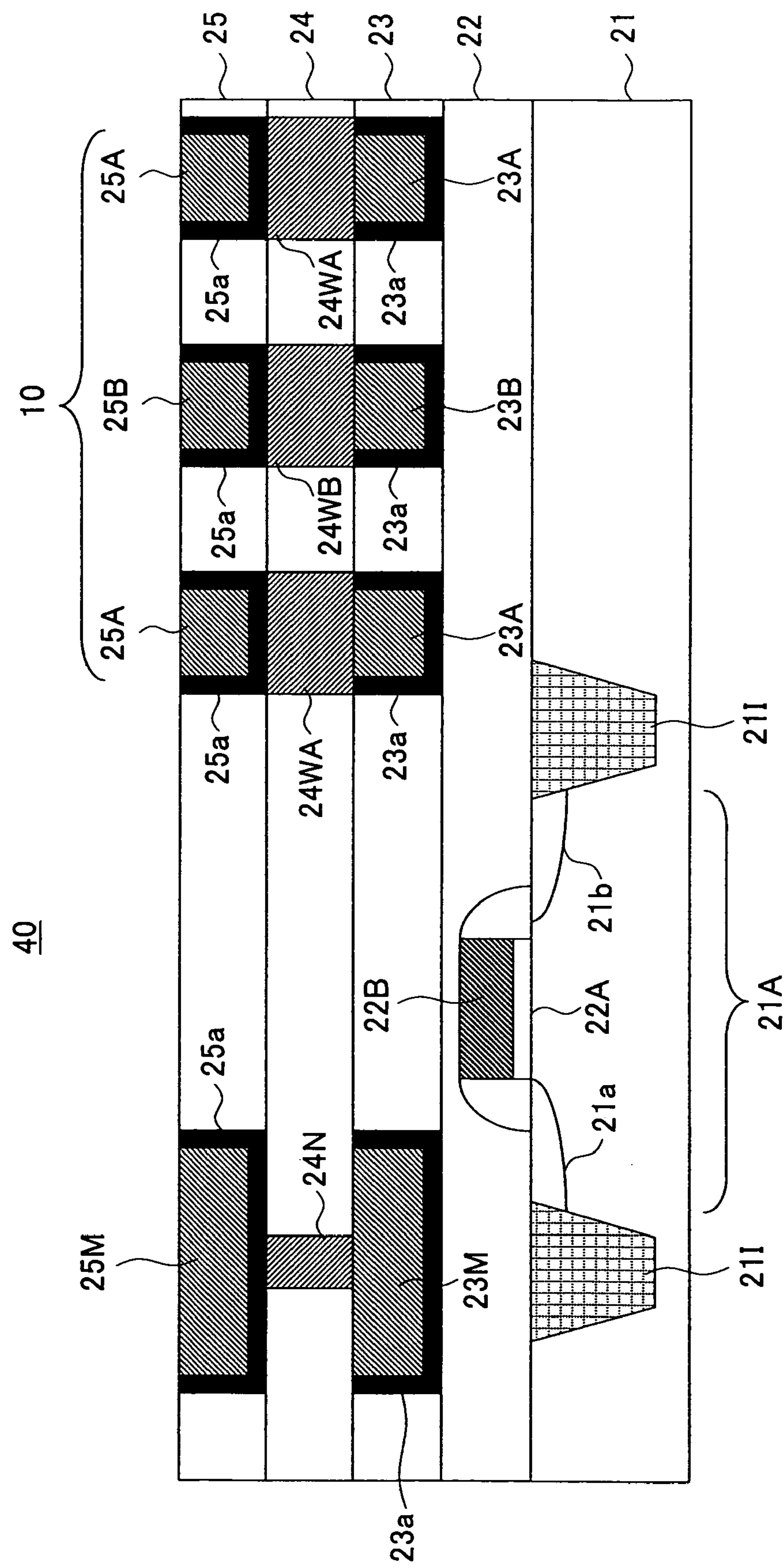
FIG. 8 is a diagram showing the construction of a semiconductor device according to a third embodiment of the present invention.

FIG. 8 is a diagram showing the construction of a semiconductor device 40 according to a third embodiment of the present invention, wherein those parts corresponding the parts described previously are designated by the same reference numerals and the description thereof will be omitted.

Referring to FIG. 8, the present invention does not use dual damascene process for formation of the multilayer interconnection structure.

More specifically, there is formed an Al interconnection pattern 23M in the interlayer insulation film 23 by a single damascene process and another Al interconnection pattern 25M is formed in the interlayer insulation film 25 by a single damascene process, wherein the Al interconnection pattern 23M and the Al interconnection pattern 25M are connected by a W (tungsten) plug 24W formed in the interlayer insulation film 24.

Similarly, the present invention uses an Al pattern for the comb-shaped patterns 23A and 25A or comb-shaped patterns 23B and 25B, and a W pattern is used for the comb-shaped patterns 24A and 24B that connects the upper and lower comb-shaped patterns.

It should be noted that such W plugs or W patterns can be formed at the time the interlayer insulation film 24 is formed on the interlayer insulation film 23 by filling a via-hole or comb-shaped trench formed in the interlayer insulation film with a W film, followed by a CMP process removing unnecessary W film from the top surface of the interlayer insulation film 24.

In the present embodiment, it should be noted that formation of the interconnection patterns 23M and 23M, the comb-shaped patterns 23A and 23B and the comb-shaped patterns 25A and 25B is not limited such a single damascene process but also may be conducted according to other processes. Further, the MIM capacitor of the present invention is useful not only in a silicon semiconductor device but also in a compound semiconductor device such as MMIC.

Further, the present invention is not limited to the embodiments described heretofore, but various variations may be made without departing from the scope of the invention.

What is claimed is:

1. A semiconductor device having an MIM capacitor in a multilayer interconnection structure, said multilayer interconnection structure comprising:

a first interconnection layer embedded in a first interlayer insulation film;

a second interlayer insulation film formed on said first interlayer insulation film;

a third interlayer insulation film formed over said first interlayer insulation film via said second interlayer insulation film;

a second interconnection layer embedded in said third interlayer insulation film; and a via-plug formed in said second interlayer insulation film so as to connect said first interconnection layer to said second interconnection layer electrically, said first interconnection layer comprising first and second conductor patterns embedded in said first interlayer insulation film and extending continuously in said first interlayer insulation film in a mutually opposing relationship, said second interconnection layer comprising third and fourth interconnection patterns embedded in said third interlayer insulation film respectively in correspondence to said first and second conductor patterns, said third and fourth conductor patterns extending continuously in said third interlayer insulation film in a mutually opposing relationship, wherein said second interlayer insulation film includes a fifth conductor pattern embedded therein so as to extend continuously in said second interlayer insulation film in correspondence to said first and third conductor patterns, said fifth conductor pattern connecting said first and third conductor patterns continuously, said second interlayer insulation film further including a sixth conductor pattern embedded therein so as to extend continuously in said second interlayer insulation film in correspondence to said second and fourth conductor patterns, said sixth conductor pattern connecting said second and fourth conductor patterns continuously, said first and second conductor patterns, said third and fourth conductor patterns and said fifth and sixth conductor patterns forming together an MIM capacitor.

2. The semiconductor device as claimed in claim 1, wherein said first, third and fifth conductor patterns have an identical shape and an identical size, and said second, fourth and sixth conductor patterns have an identical shape and an identical size.

3. The semiconductor device as claimed in claim 1, wherein said fifth conductor pattern is formed in continuation to said third conductor pattern, said fifth conductor pattern making a contact with said first conductor pattern at a bottom part thereof, said sixth conductor pattern is formed in continuation to said fourth conductor pattern, said sixth conductor pattern making a contact with said second conductor pattern at a bottom part thereof.

4. The semiconductor device as claimed in claim 3, wherein said third and fourth conductor patterns being exposed at a surface of said third interlayer insulation film, said third and fourth conductor patterns having respective exposed surfaces flush with said surface of said third interlayer insulation film.

5. The semiconductor device as claimed in claim 3, wherein said third conductor pattern has a sidewall surface formed with a first barrier metal film, said first barrier metal film further covering a sidewall surface and a bottom surface of said fifth conductor pattern continuously, and wherein said fourth conductor pattern has a sidewall surface covered by a second barrier metal film, said second barrier metal film covering a sidewall surface and a bottom surface of said sixth conductor pattern continuously.

6. The semiconductor device as claimed in claim 3, wherein there is formed a first insulation film at an interface between said first interlayer insulation film and said second interlayer insulation film as an etching stopper, and wherein there is formed a second insulation film at an interface between said second interlayer insulation film and said third interlayer insulation film.

7. The semiconductor device as claimed in claim 1, wherein said fifth and sixth conductor patterns are formed of a material different from said third and fourth conductor patterns.

8. The semiconductor device as claimed in claim 7, wherein said third and fourth conductor patterns have respective sidewall surfaces and bottom surfaces covered by a refractory metal film.

9. The semiconductor device as claimed in claim 1, wherein said first and second conductor patterns form a comb-shaped electrode pattern, and wherein said third and fourth conductor patterns and said fifth and sixth conductor patterns form respective combs-shaped electrode patterns corresponding to said comb-shaped electrode pattern.

* * * * *